(12) United States Patent
Imaizumi et al.

(10) Patent No.: US 12,306,255 B2
(45) Date of Patent: May 20, 2025

(54) BATTERY VOLTAGE MONITORING DEVICE

(71) Applicants: ABLIC Inc., Tokyo (JP); Tianjin Lishen Battery Co., Ltd., Tianjin (CN)

(72) Inventors: Eiki Imaizumi, Tokyo (JP); Toshiyuki Uchida, Tokyo (JP); Biao Shen, Tokyo (JP); Kazuhisa Suzuki, Tokyo (JP)

(73) Assignees: ABLIC Inc., Tianjin (CN); Tianjin Lishen Battery Co., Ltd., Tianjin (CN)

( * ) Notice: Subject to any disclaimer, the term of this patent is extended or adjusted under 35 U.S.C. 154(b) by 146 days.

(21) Appl. No.: 18/184,633

(22) Filed: Mar. 15, 2023

(65) Prior Publication Data
US 2023/0314521 A1 Oct. 5, 2023

(30) Foreign Application Priority Data

Mar. 31, 2022 (JP) .................. 2022-060951

(51) Int. Cl.
G01R 31/3835 (2019.01)
H02J 7/00 (2006.01)
H03M 1/12 (2006.01)
(52) U.S. Cl.
CPC ........ *G01R 31/3835* (2019.01); *H02J 7/0047* (2013.01); *H03M 1/124* (2013.01)

(58) Field of Classification Search
None
See application file for complete search history.

(56) References Cited

U.S. PATENT DOCUMENTS

2023/0039404 A1* 2/2023 Kim ..................... B60L 3/0046

FOREIGN PATENT DOCUMENTS

JP 2015083960 4/2015

* cited by examiner

Primary Examiner — Jas A Sanghera
(74) Attorney, Agent, or Firm — JCIPRNET

(57) ABSTRACT

A battery voltage monitoring device includes a clock generation circuit; a switch circuit including first and second N-type transistors and first and second P-type transistors of which sources and back gates are connected to each other, with a drain of one of the first N-type transistor and the first P-type transistor connected to the other source, one source connected to a signal input unit, and the other drain connected to a signal output unit, and a source of one of the second N-type transistor and the second P-type transistor connected to the other source, one source connected to a signal input unit, and the other drain connected to a signal output unit; a first generation circuit generating first and second control signals for the first and second P-type transistors, respectively; and a second generation circuit generating third and fourth control signals for the first and second N-type transistors, respectively.

6 Claims, 5 Drawing Sheets

BATTERY VOLTAGE MONITORING DEVICE

CROSS-REFERENCE TO RELATED APPLICATION

This application claims the priority benefit of Japan application serial no. 2022-060951, filed on Mar. 31, 2022. The entirety of the above-mentioned patent application is hereby incorporated by reference herein and made a part of this specification.

BACKGROUND

Technical Field

The present invention relates to a battery voltage monitoring device.

Description of Related Art

A battery system uses a battery pack in which battery cells are connected in series or in parallel. A voltage of each of the battery cells is monitored by a battery voltage monitoring device such as a battery voltage monitoring integrated circuit (IC) that measures each voltage.

In addition, the individual battery cells of the battery pack are physically connected by screws that connect bus bars to each other. In a case where the screws that connect the bus bars become loose, problems such as abnormal voltage and heat generation may occur, and thus a circuit for monitoring voltages at both ends of the bus bar is provided.

In a battery system, a technology for monitoring the voltages at both ends of a bus bar is known (refer to Patent Document 1, for example). According to such a technology, the battery system includes a voltage detection unit that monitors the voltages at both ends of the bus bar. A circuit of the voltage detection unit is configured as a discrete component outside an IC without being included in a battery voltage monitoring IC and a control IC.

SUMMARY

There is a demand for miniaturization of a battery system. However, with the above-described technology, since the circuit for monitoring the voltages at both ends of the bus bar is configured outside the IC, it is difficult to meet the demand for miniaturization.

The present invention provides a battery voltage monitoring device capable of being built into a battery system.

A battery voltage monitoring device of the present invention is a battery voltage monitoring device for monitoring voltages at both ends of a bus bar, which comprises a signal input unit having input ports which receive the voltages at both ends of the bus bar, and an analog-digital conversion circuit configured to measure a difference voltage between the voltages at both ends of the bus bar, the device including a clock generation circuit configured to generate a plurality of clocks including a first clock, a second clock having a polarity opposite to that of the first clock, a third clock being at a low level while the first clock is at a high level, and a fourth clock having a polarity opposite to that of the third clock and being at a high level while the second clock is at a low level, based on an input reference clock; a switch circuit including a first N-type transfer transistor and a second N-type transfer transistor that are N-type field effect transistors of which sources and back gates are connected, and a first P-type transfer transistor and a second P-type transfer transistor that are P-type field effect transistors of which sources and back gates are connected, a drain of one of the first N-type transfer transistor and the first P-type transfer transistor being connected to a source of the other transfer transistor, a source of one transfer transistor being connected to a first signal input port, a drain of the other transfer transistor being connected to a first signal output port, a drain of one of the second N-type transfer transistor and the second P-type transfer transistor being connected to a source of the other transfer transistor, a source of one transfer transistor being connected to the first signal input port, and a drain of the other transfer transistor being connected to a second signal output port; a first control signal generation circuit configured to generate a first control signal for controlling an ON state and an OFF state of the first P-type transfer transistor based on a voltage of the first signal input port and the second clock, and configured to generate a second control signal for controlling an ON state and an OFF state of the second P-type transfer transistor based on the voltage of the first signal input port and the fourth clock; and a second control signal generation circuit configured to generate a third control signal for controlling an ON state and an OFF state of the first N-type transfer transistor based on the voltage of the first signal input port and the first clock, and configured to generate a fourth control signal for controlling an ON state and an OFF state of the second N-type transfer transistor based on the voltage of the first signal input port and the third clock.

According to the present invention, the battery voltage monitoring device capable of being built into a battery system can be provided.

DESCRIPTION OF THE EMBODIMENTS

Figure 1:
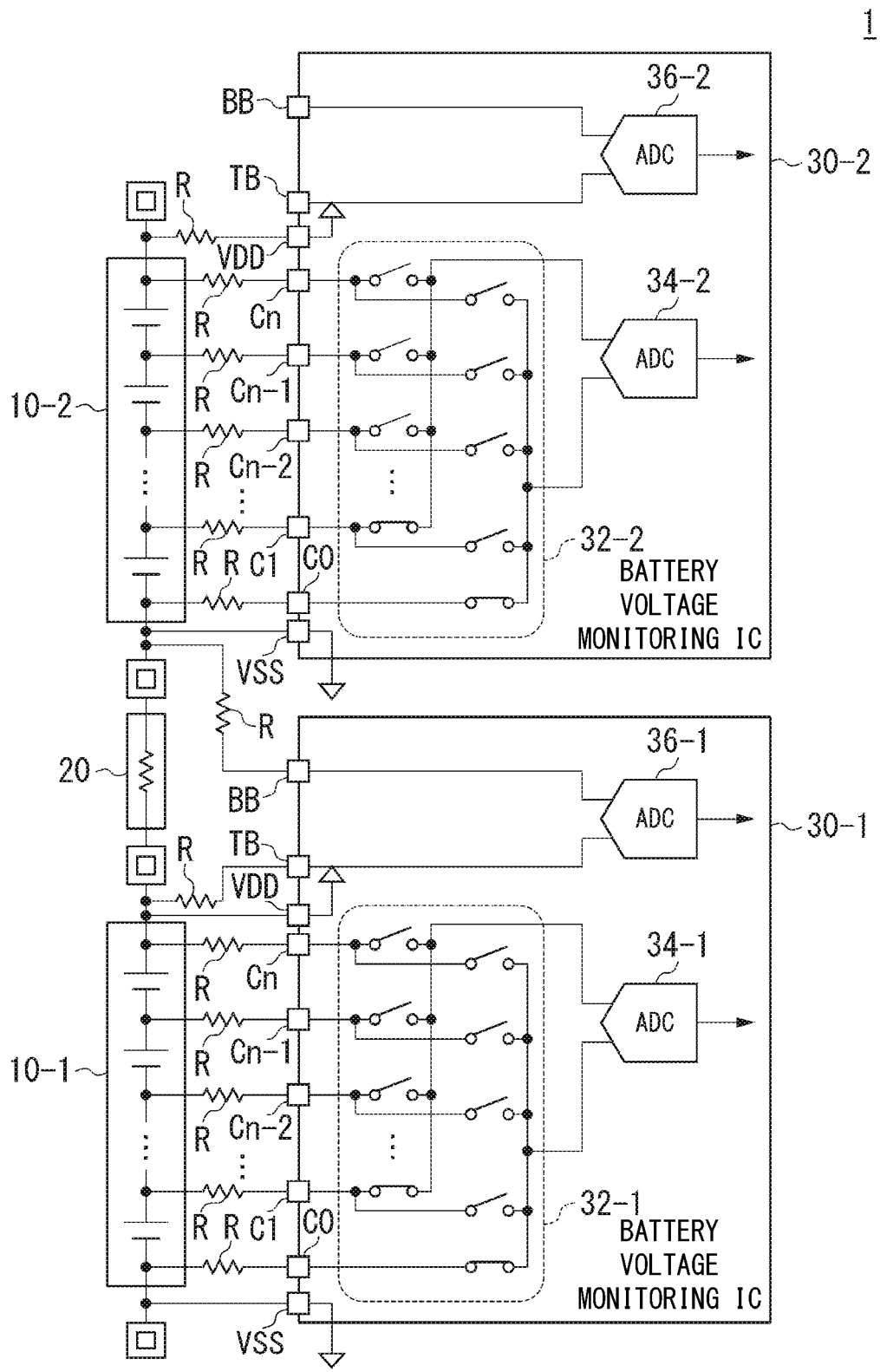
FIG. 1 is a diagram illustrating a configuration example of a battery system according to an embodiment of the present invention.

Next, a battery voltage monitoring device of an embodiment will be described with reference to the accompanying drawings. The embodiment described below is merely an example, and the embodiment to which the present invention is applied is not limited to the following embodiment.

In all the drawings for describing the embodiment, the same reference numerals are used for those having the same functions, and repeated descriptions thereof will be omitted.

In addition, "based on XX" in the present application means "based on at least XX," and includes cases based on other elements in addition to XX. Moreover, "based on XX" is not limited to a case in which XX is used directly, and also includes a case of being based on what has been calculated or processed with respect to XX. "XX" is an arbitrary element (for example, arbitrary information).

Embodiment (Battery System)

FIG. 1 is a diagram illustrating a configuration example of a battery system according to an embodiment of the present invention. In FIG. 1, the battery system 1 includes a battery cell 10-1, a battery cell 10-2, a bus bar 20, a battery voltage monitoring IC 30-1, and a battery voltage monitoring IC 30-2. The battery voltage monitoring IC 30-1 and the battery voltage monitoring IC 30-2 are an example of a battery voltage monitoring device.

The battery cell 10-1 is, for example, one in which n batteries (n is an integer of n>0) are connected in series. The battery cell 10-2 is, for example, one in which n batteries are connected in series. One example of a battery is a lithium battery.

The bus bar 20 is an electrode that connects the battery cell 10-1 to the battery cell 10-2.

The battery voltage monitoring IC 30-1 includes ports C0 to Cn which receive a voltage VC0 and a voltage VCn at both ends of the battery cell 10-1 and voltages VC1 to VCn−1 between each of the n batteries included in the battery cell 10-1 via resistors R. Each of the resistors R is a protection resistor.

The battery voltage monitoring IC 30-1 includes a port VSS and a port VDD which receive the voltage VC0 and the voltage VCn at both ends of the battery cell 10-1. The battery voltage monitoring IC 30-1 is fabricated, for example, on a P-type semiconductor substrate.

The battery voltage monitoring IC 30-1 includes a multiplexer 32-1 connected to each of the ports C0 to Cn, a first analog-to-digital converter (ADC) 34-1 connected to the multiplexer 32-1, a port BB and a port TB which receive a voltage VBB and a voltage VTB at both ends of the bus bar 20 via resistors R, and a second ADC 36-1 that is connected to the port BB and the port TB and measures a difference voltage between the voltage VBB and the voltage VTB.

The battery voltage monitoring IC 30-2 includes ports C0 to Cn which receive a voltage VC0 and a voltage VCn at both ends of the battery cell 10-2 and voltages VC1 to VCn−1 between each of the n batteries included in the battery cell 10-2 via resistors R.

The battery voltage monitoring IC 30-2 includes a port VSS and a port VDD which receive a voltage VC0 and a voltage VCn at both ends of the battery cell 10-2.

The battery voltage monitoring IC 30-2 includes a multiplexer 32-2 connected to each of ports C0 to Cn, a first ADC 34-2 connected to the multiplexer 32-2, a port BB and a port TB which receive a voltage VBB and a voltage VTB at both ends of the bus bar (not illustrated) via resistors R, and a second ADC 36-2 that is connected to the port BB and the port TB and measures a difference voltage between the voltage VBB and the voltage VTB.

Since the battery voltage monitoring IC 30-1 and the battery voltage monitoring IC 30-2 have the same configuration, the battery voltage monitoring IC 30-1 will be mainly described below.

Figure 2:
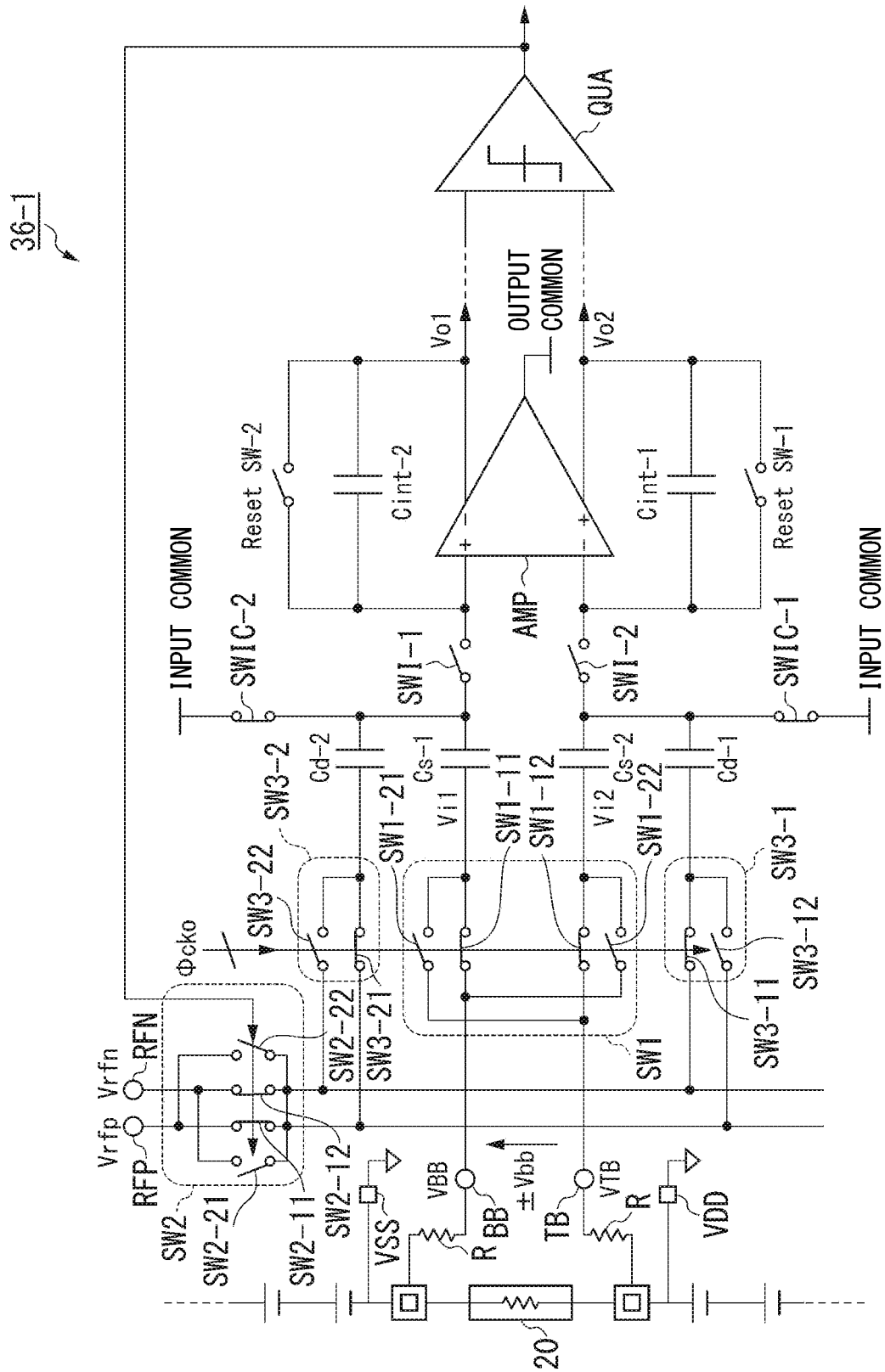
FIG. 2 is a diagram illustrating an example of a second ADC of the battery system according to the embodiment.

FIG. 2 is a diagram illustrating an example of the second ADC of the battery system according to the embodiment. The second ADC 36-1 measures a voltage between the port BB and the port TB which receive the voltage VBB and the voltage VTB at both ends of the bus bar 20 via the resistor R, respectively.

The second ADC 36-1 needs to measure positive and negative voltages because a charging current and a discharging current flow through the bus bar 20. Thus, the second ADC 36-1 has a different configuration of an input switch from that of the first ADC 34-1. The second ADC 36-1 can apply an oversampling ADC. FIG. 2 illustrates an example of a first-stage integration circuit of the oversampling ADC.

The second ADC 36-1 includes a first switch SW1, a second switch SW2, a third switch SW3-1, a third switch SW3-2, a first sample capacitor Cs-1, a second sample capacitor Cs-2, a first capacitor Cd-1, a second capacitor Cd-2, an amplifier AMP, a first integration capacitor Cint-1, a second integration capacitor Cint-2, a reset switch SW-1, and a reset switch SW-2.

The first switch SW1 includes a switch SW1-11, a switch SW1-12, a switch SW1-21, and a switch SW1-22. The port BB and the first sample capacitor Cs-1 are connected via the switch SW1-11. The port BB and the second sample capacitor Cs-2 are connected via the switch SW1-22. The port TB and the first sample capacitor Cs-1 are connected via the switch SW1-21. The port TB and the second sample capacitor Cs-2 are connected via the switch SW1-12.

The second switch SW2 includes a switch SW2-11, a switch SW2-12, a switch SW2-21, and a switch SW2-22. The third switch SW3-1 includes a switch SW3-11 and a switch SW3-12. The third switch SW3-2 includes a switch SW3-21 and a switch SW3-22.

A port RFP to which a reference voltage Vrfp is applied and the first capacitor Cd-1 are connected via the switch SW2-11 and the switch SW3-12, and the port RFP and the second capacitor Cd-2 are connected via the switch SW2-11 and the switch SW3-21.

The port RFP and the first capacitor Cd-1 are connected via the switch SW2-22 and the switch SW3-11, and the port RFP and the second capacitor Cd-2 are connected via switches SW2-22 and SW3-22.

A port RFN to which a reference voltage Vrfn is applied and the first capacitor Cd-1 are connected via the switch SW2-12 and the switch SW3-11, and the port RFN and second capacitor Cd-2 are connected via switch SW2-12 and switch SW3-22.

The port RFN and the first capacitor Cd-1 are connected via the switch SW2-21 and the switch SW3-12, and the port RFN and second capacitor Cd-2 are connected via switch SW2-21 and switch SW3-21.

The first sample capacitor Cs-1 and the second sample capacitor Cd-2 are grounded via the switch SWIC-2. The first sample capacitor Cs-1 and the second capacitor Cd-2 are connected to a non-inverting input port of the amplifier AMP via the switch SWI-1.

The second sample capacitor Cs-2 and the first capacitor Cd-1 are grounded via the switch SWIC-1. The second sample capacitor Cs-2 and the first capacitor Cd-1 are connected to the inverting input port of the amplifier AMP via the switch SWI-2.

The first integration capacitor Cint-1, the second integration capacitor Cint-2, the reset switch SW-1, and the reset switch SW-2 are connected to input and output ports of the amplifier AMP.

An output of the amplifier AMP is received by a quantizer QUA via, for example, an amplifier in the next stage. An output of the quantizer QUA is received by the second switch SW2.

The operation of the second ADC 36-1 will be described.

First, in order to discharge (reset) by short-circuiting both ends of each of the first integration capacitor Cint-1 and the second integration capacitor Cint-2, each of the reset switch SW-1 and the reset switch SW-2 is once closed and then opened after a predetermined time. The open state remains for a predetermined period of time.

During the predetermined period of time, the switch SW1-11 and the switch SW1-12 of the first switch SW1, the switch SW3-11 of the third switch SW3-1, the switch SW3-21 of the third switch SW3-2, the switch SWIC-1, and the switch SWIC-2 are turned on by a clock signal Φcko. The clock signal Φcko will be described below.

During the predetermined period of time, the switch SW1-21 and the switch SW1-22 of the first switch SW1, the switch SW3-12 of the third switch SW3-1, the switch SW3-22 of the third switch SW3-2, the switch SWI-1, and the switch SWI-2 are turned off by the clock signal Φcko.

A terminal voltage VBB of the bus bar 20 is applied to the first sample capacitor Cs-1, and charges are accumulated in the first sample capacitor Cs-1. A terminal voltage VTB of the bus bar 20 is applied to the second sample capacitor Cs-2, and charges are accumulated in the second sample capacitor Cs-2.

The quantizer QUA has been reset to an initial value. In the second switch SW2, one of the switch SW2-12, the switch SW2-21, the switch SW2-11, and the switch SW2-22 is selected according to the initial value of the quantizer QUA.

Due to the selection of one of the switch SW2-12, the switch SW2-21, the switch SW2-11, and the switch SW2-22, the reference voltage Vrfp or the reference voltage Vrfn is applied to the first capacitor Cd-1 and the second capacitor Cd-2, and charges are accumulated in the first capacitor Cd-1 and the second capacitor Cd-2.

In each of the first sample capacitor Cs-1 and the second capacitor Cd-2, the other end opposite to the switch SW1-11 and the switch SW3-21 is biased by turning on the switch SWIC-2 to input common. In each of the second sample capacitor Cs-2 and the first capacitor Cd-1, the other end opposite to the switch SW1-12 and the switch SW3-11 is biased by turning on the switch SWIC-1 to the input common.

Next, due to a change in the clock signal Φcko, the switch SW1-11 and the switch SW1-12 of the first switch SW1, the switch SW3-11 of the third switch SW3-1, the switch SW3-21 of the third switch SW3-2, the switch SWIC-1, and the switch SWIC-2 are turned off.

Due to the change in the clock signal Φcko, the switch SW1-21 and the switch SW1-22 of the first switch SW1, the switch SW3-12 of the third switch SW3-1, the switch SW3-22 of the third switch SW3-2, the switch SWI-1, and the switch SWI-2 are turned on.

The first sample capacitor Cs-1, the second sample capacitor Cs-2, the first capacitor Cd-1 and the second capacitor Cd-2 biased to the input common are disconnected from the input common by turning off the input common switch SWIC-1 and the input common switch SWIC-2. Since the switch SWI-1 is turned on, the first sample capacitor Cs-1, the second sample capacitor Cs-2, the first capacitor Cd-1, and the second capacitor Cd-2 are connected to the amplifier AMP.

The terminal voltage VTB of the bus bar 20 is applied to the first sample capacitor Cs-1, and charges are accumulated in the first sample capacitor Cs-1. The charges accumulated in the first sample capacitor Cs-1 together with the previously accumulated charges are transferred to the integration capacitor Cint-2 between the input and output of the amplifier AMP, and the voltage is integrated. Furthermore, the charges accumulated in the second capacitor Cd-2 is transferred to the integration capacitor Cint-2 between the input and output of the amplifier AMP, and the voltage is integrated.

The terminal voltage VBB of the bus bar 20 is applied to the second sample capacitor Cs-2, and charges are accumulated in the second sample capacitor Cs-2. The charges accumulated in the second sample capacitor Cs-2 together with the previously accumulated charges are transferred to the integration capacitor Cint-1 between the input and output of the amplifier AMP, and the voltage is integrated. Further, the charges accumulated in the first capacitor Cd-1 is transferred to the integration capacitor Cint-1 between the input and output of the amplifier AMP, the voltage is integrated, and thus an integration operation is performed.

The output of the quantizer QUA changes due to the integration operation. The second switch SW2 is switched between the switch SW2-12, the switch SW2-21, the switch SW2-11, and the switch SW2-22 by changing the output of the quantizer QUA.

The reference voltage Vrfp or the reference voltage Vrfn is applied to the first capacitor Cd-1 and the second capacitor Cd-2, and charges are accumulated in the first capacitor Cd-1 and the second capacitor Cd-2 by switching between the switch SW2-12, the switch SW2-21, the switch SW2-11, and the switch SW2-22. Thereafter, the operation is repeated for a predetermined period of time each time the clock signal Φcko changes.

An analog-to-digital conversion value corresponding to the input bus bar voltage Vbb can be obtained from a series of stream data output from the quantizer QUA by repeating the above operation. Since the analog-to-digital conversion value corresponding to the bus bar voltage Vbb can be obtained, the voltages at both ends of the bus bar 20 can be monitored.

The first switch SW1 will be described. Since polarities of the terminal voltage VTB and the terminal voltage VBB of the bus bar 20 are reversed, the first switch SW1 is configured so that the current does not flow backward.

Figure 3:
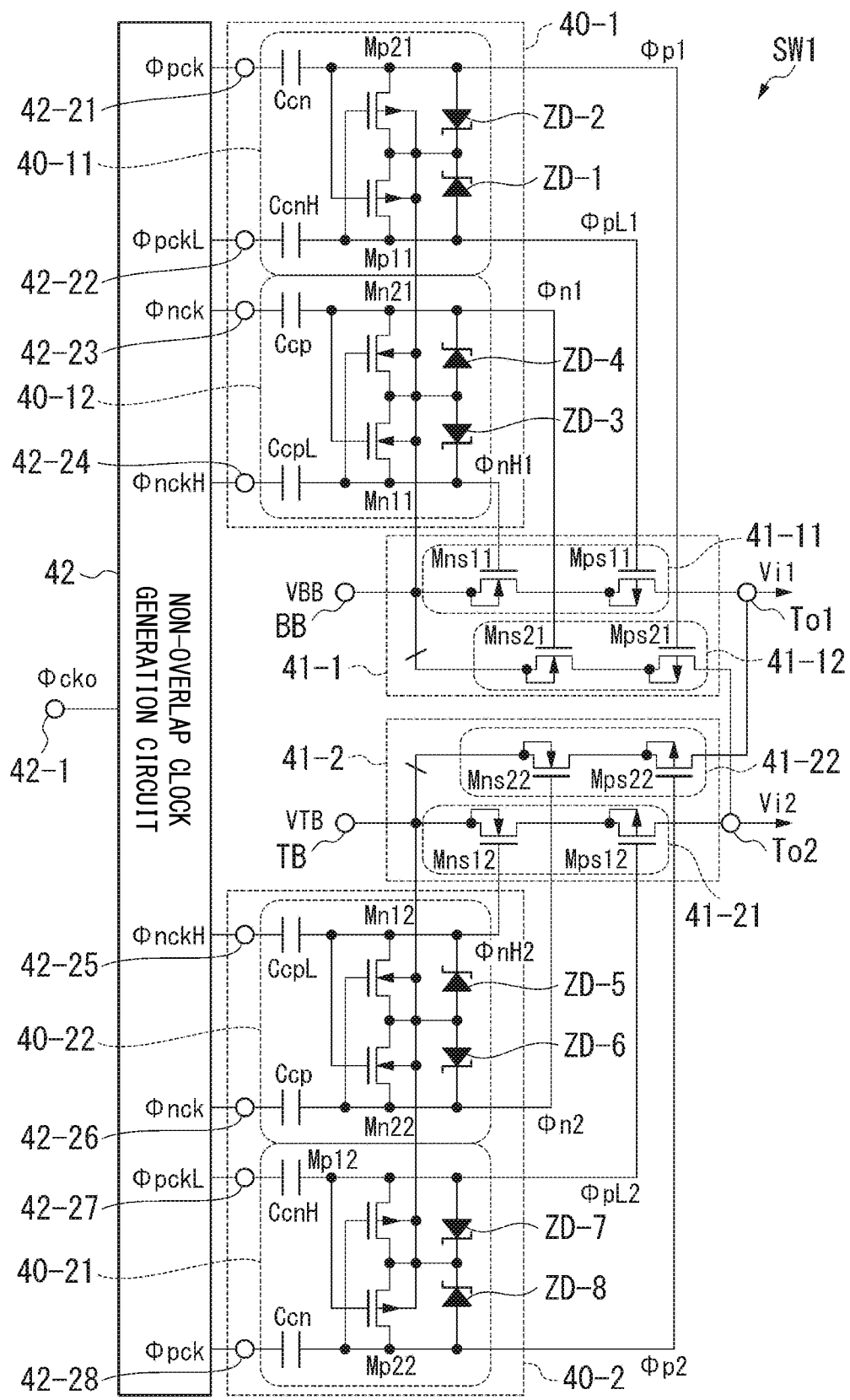
FIG. 3 is a diagram illustrating an example of a first switch included in a battery voltage monitoring IC of the battery system according to the embodiment.

FIG. 3 is a diagram illustrating an example of the first switch included in the battery voltage monitoring IC of the battery system according to the embodiment.

The first switch SW1 includes a first clock bootstrap circuit 40-1, a second clock bootstrap circuit 40-2, a first switch 41-1, a second switch 41-2, and a non-overlap clock generation circuit 42. The first switch 41-1 and the second switch 41-2 are examples of switch circuits, and the non-overlap clock generation circuit 42 is an example of a clock generation circuit.

The non-overlap clock generation circuit 42 includes a clock input port 42-1 and eight clock output ports 42-21, 42-22, 42-23, 42-24, 42-25, 42-26, 42-27, and 42-28.

The first clock bootstrap circuit 40-1 includes a first step-down circuit 40-11 and a first step-up circuit 40-12. The first step-down circuit 40-11 is an example of a first control signal generation circuit, and the first step-up circuit 40-12 is an example of a second control signal generation circuit. The first clock bootstrap circuit 40-1 is configured to be capable of generating a control signal for controlling an ON state and an OFF state of a field effect transistor (FET) included in each of the first step-down circuit 40-11 and the first step-up circuit 40-12.

The first switch 41-1 includes a first metal-oxide-semiconductor (MOS) switch 41-11 and a second MOS switch 41-12.

The first MOS switch 41-11 includes at least one NMOS transistor Mns11 (a first N-type transfer transistor Mns11) which is an N-type FET, and at least one PMOS transistor Mps11 (a first P-type transfer transistor Mps11) which is a P-type FET. FIG. 3 illustrates, as an example, a case in which the first MOS switch 41-11 includes one NMOS transistor Mns11 and one PMOS transistor Mps11.

The second MOS switch 41-12 includes at least one NMOS transistor Mns21 (a second N-type transfer transistor Mns21) which is an N-type FET, and at least one PMOS transistor Mps21 (a second P-type transfer transistor Mps21) which is a P-type FET. FIG. 3 illustrates, as an example, a case in which the second MOS switch 41-12 includes one NMOS transistor Mns21 and one PMOS transistor Mps21.

The second clock bootstrap circuit 40-2 includes a second step-down circuit 40-21 and a second step-up circuit 40-22. The second step-down circuit 40-21 is an example of a third control signal generation circuit, and the second step-up circuit 40-22 is an example of a fourth control signal generation circuit. The second clock bootstrap circuit 40-2 is configured to be capable of generating a control signal for controlling an ON state and an OFF state of the FET included in each of the second step-down circuit 40-21 and the second step-up circuit 40-22.

The second switch 41-2 includes a first MOS switch 41-21 and a second MOS switch 41-22.

The first MOS switch 41-21 includes at least one NMOS transistor Mns12 (a third N-type transfer transistor Mns12) which is an N-type FET, and at least one PMOS transistor Mps12 (a third P-type transfer transistor Mps12) which is a P-type FET. FIG. 3 illustrates, as an example, a case in which the first MOS switch 41-21 includes one NMOS transistor Mns12 and one PMOS transistor Mps12.

The second MOS switch 41-22 includes at least one NMOS transistor Mns22 (a fourth N-type transfer transistor Mns22) which is an N-type FET, and at least one PMOS transistor Mps22 (a fourth P-type transfer transistor Mps22) which is a P-type FET. FIG. 3 illustrates, as an example, a case in which the second MOS switch 41-22 includes one NMOS transistor Mns22 and one PMOS transistor Mps22.

The non-overlap clock generation circuit 42 is connected to the first clock bootstrap circuit 40-1. The first clock bootstrap circuit 40-1 is connected to the first switch 41-1.

More specifically, the first step-down circuit 40-11 is connected to the clock output ports 42-21 and 42-22. Further, the first step-down circuit 40-11 is connected to a gate of the PMOS transistor Mps11 included in the first MOS switch 41-11 and a gate of the PMOS transistor Mps21 included in the second MOS switch 41-12.

The first step-up circuit 40-12 is connected to the clock output ports 42-23 and 42-24. Further, the first step-up circuit 40-12 is connected to a gate of the NMOS transistor Mns11 included in the first MOS switch 41-11 and a gate of the NMOS transistor Mns21 included in the second MOS switch 41-12.

The first step-down circuit 40-11 includes two capacitors Ccn and CcnH, two PMOS transistors Mp21 and Mp11 which are P-type field effect transistors (FET), and two Zener diodes ZD-1 and ZD-2. The capacitor Ccn is an example of a first capacitor, and the capacitor CcnH is an example of a second capacitor. The PMOS transistor Mp21 is an example of a first P-type FET, and the PMOS transistor Mph1 is an example of a second P-type FET. The Zener diode ZD-1 is an example of a first Zener diode, and the Zener diode ZD-2 is an example of a second Zener diode.

One end of the capacitor Ccn is connected to the clock output port 42-21. One end of the capacitor CcnH is connected to the clock output port 42-22. The other end of capacitor Ccn is connected to a drain of PMOS transistor Mp21 and a gate of PMOS transistor Mp11. A connection point thereof is called a node N1.

A source of the PMOS transistor Mp21 is connected to a source of the PMOS transistor Mp11. Sources and back gates of the PMOS transistors Mp11 and Mp21 are connected to each other, respectively. That is, the source and the back gate of PMOS transistor Mp21 and the source and the back gate of PMOS transistor Mph1 are respectively connected to each other. As connection point thereof is called a node N3. A drain of the PMOS transistor Mph is connected to the other end of the capacitor CcnH and a gate of the PMOS transistor Mp21. A connection point thereof is called a node N2.

The Zener diode ZD-2 is further connected between the node N1 and the node N3. The Zener diode ZD-2 includes an anode connected to the node N1 and a cathode connected to the node N3.

Also, the Zener diode ZD-1 is further connected between the node N2 and the node N3. The Zener diode ZD-1 includes an anode connected to the node N2 and a cathode connected to the node N3.

The first step-down circuit 40-11 configured in this way operates as a step-down circuit that steps down an input voltage and outputs the stepped-down voltage. The first step-down circuit 40-11 is configured to be capable of outputting a control signal for controlling an operation state of the PMOS transistor from each of the nodes N1 and N2. Withstand voltages of the capacitors Ccn and CcnH are selected in consideration of a voltage received by the first step-down circuit 40-11.

The first step-up circuit 40-12 includes two capacitors Ccp and CcpL, two NMOS transistors Mn21 and Mn11 which are N-type field effect transistors, and two Zener diodes ZD-3 and ZD-4. The capacitor Ccp is an example of a third capacitor, and the capacitor CcpL is an example of a fourth capacitor. The NMOS transistor Mn21 is an example of a second N-type FET, and the NMOS transistor Mn11 is an example of a first N-type FET. The Zener diode ZD-3 is an example of a third Zener diode, and the Zener diode ZD-4 is an example of a fourth Zener diode.

One end of the capacitor Cep is connected to the clock output port 42-23. One end of the capacitor CcpL is connected to the clock output port 42-24. The other end of the capacitor Ccp is connected to a drain of the NMOS transistor Mn21 and a gate of the NMOS transistor Mn11. A connection point thereof is called a node N4.

A source of the NMOS transistor Mn21 is connected to a source of the NMOS transistor Mn11. The sources and the back gates of the NMOS transistors Mn21 and Mn11 are connected each other, respectively. That is, the source and the back gate of the NMOS transistor Mn21 and the source and the back gate of the NMOS transistor Mn11 are respectively connected to each other. A connection point thereof is called a node N6. A drain of the NMOS transistor Mn11 is connected to the other end of the capacitor CcpL and a gate of the NMOS transistor Mn21. A connection point thereof is called a node N5.

The Zener diode ZD-4 is further connected between the node N4 and the node N6. The Zener diode ZD-4 includes an anode connected to the node N6 and a cathode connected to the node N4. Also, the Zener diode ZD-3 is further connected between the node N5 and the node N6. The Zener diode ZD-3 includes an anode connected to the node N6 and a cathode connected to the node N5.

The first step-up circuit 40-12 configured in this way operates as a step-up circuit that steps up an input voltage and outputs the stepped-up voltage. The first step-up circuit 40-12 is configured to be capable of outputting a control signal for controlling the operation state of the NMOS transistor from each of the nodes N4 and N5. Withstand voltages of the capacitors Ccp and CcpL are selected in consideration of the voltage received by the first step-up circuit 40-12.

Also, the first step-down circuit 40-11 and the first step-up circuit 40-12 are connected at the node N3 and the node N6. Furthermore, the node N3 and the node N6 are connected to a connection point between the port BB and the source of the NMOS transistor Mns11 of the first MOS switch 41-11 and the source of the NMOS transistor Mns21 of the second MOS switch 41-12. Thus, the node N3, the node N6, the port BB, the source of the NMOS transistor Mns11 and the source of the NMOS transistor Mns21 form the same node.

In the first switch 41-1, the first MOS switch 41-11 includes one NMOS transistor Mns11 and one PMOS transistor Mps11. In the first MOS switch 41-11, the NMOS transistor Mns11 and the PMOS transistor Mps11 are connected. Also, the sources and the back gates of the NMOS transistor Mns11 and the PMOS transistor Mps11 are respectively connected to each other.

The source of the NMOS transistor Mns11 is connected to the port BB and the back gate of the NMOS transistor Mn11. The drain of the NMOS transistor Mns11 is connected to the source of the PMOS transistor Mps11. The drain of the PMOS transistor Mps11 is connected to a signal output port To1.

The gate of the NMOS transistor Mns11 is connected to the cathode of the Zener diode ZD-3, the drain of the NMOS transistor Mn11, the gate of the NMOS transistor Mn21, and the other end of the capacitor CcpL. The gate of the PMOS transistor Mps11 is connected to the anode of the Zener diode ZD-1, the drain of the PMOS transistor Mp11, the gate of the PMOS transistor Mp21, and the other end of the capacitor CcnH.

The non-overlap clock generation circuit 42 is connected to the second clock bootstrap circuit 40-2. The second clock bootstrap circuit 40-2 is connected to the second switch 41-2.

More specifically, the second step-down circuit 40-21 is connected to the clock output ports 42-27 and 42-28. Further, the second step-down circuit 40-21 is also connected to the gate of the PMOS transistor Mps12 (the third P-type transfer transistor Mps12) included in the first MOS switch 41-21 and the gate of the PMOS transistor Mps22 (the fourth P-type transfer transistor Mps22) included in the second MOS switch 41-22.

The second step-up circuit 40-22 is connected to the clock output ports 42-25 and 42-26. Further, the second step-up circuit 40-22 is also connected to the gate of the NMOS transistor Mns12 (the third N-type transfer transistor Mns12) included in the first MOS switch 41-21 and the gate of the NMOS transistor Mns22 (the fourth P-type transfer transistor Mpn22) included in the second MOS switch 41-22.

The second step-down circuit 40-21 includes two capacitors Ccn and CcnH, two PMOS transistors Mp12 and Mp22 which are P-type field effect transistors (FET), and two Zener diodes ZD-7 and ZD-8. The capacitor Ccn is an example of a first capacitor, and the capacitor CcnH is an example of a second capacitor. The PMOS transistor Mp22 is an example of a first P-type FET, and the PMOS transistor Mp12 is an example of a second P-type FET. The Zener diode ZD-7 is an example of a first Zener diode, and Zener diode ZD-2 is an example of a second Zener diode.

One end of the capacitor Ccn is connected to the clock output port 42-28. One end of the capacitor CcnH is connected to the clock output port 42-27. The other end of capacitor Ccn is connected to the drain of the PMOS transistor Mp22 and the gate of the PMOS transistor Mp12. A connection point thereof is called a node N7.

The source of the PMOS transistor Mp22 is connected to the source of the PMOS transistor Mp12. The sources and the back gates of the PMOS transistors Mp12 and Mp22 are respectively connected to each other. That is, the source and the back gate of the PMOS transistor Mp22 and the source and the back gate of the PMOS transistor Mp12 are connected to each other. A connection point thereof is called a node N9. The drain of the PMOS transistor Mp12 is connected to the other end of the capacitor CcnH and the gate of the PMOS transistor Mp22. A connection point thereof is called a node N8.

The Zener diode ZD-8 is further connected between the node N7 and the node N9. The Zener diode ZD-8 includes an anode connected to the node N7 and a cathode connected to the node N9.

Also, the Zener diode ZD-7 is further connected between the node N8 and the node N9. The Zener diode ZD-7 includes an anode connected to the node N8 and a cathode connected to the node N9.

The second step-down circuit 40-21 configured in this way operates as a step-down circuit that steps down an input voltage and outputs the stepped-down voltage. The second step-down circuit 40-21 is configured to be capable of outputting a control signal for controlling the operation state of the PMOS transistor from each of the nodes N7 and N8. Withstand voltages of the capacitors Ccn and CcnH are selected in consideration of the voltage received by the second step-down circuit 40-21.

The second step-up circuit 40-22 includes two capacitors Ccp and CcpL, two NMOS transistors Mn12 and Mn22 which are N-type field effect transistors, and two Zener diodes ZD-5 and ZD-6. The capacitor Ccp is an example of a third capacitor, and capacitor CcpL is an example of a fourth capacitor. The NMOS transistor Mn22 is an example of a first N-type FET, and the NMOS transistor Mn12 is an example of a second N-type FET. The Zener diode ZD-5 is an example of a third Zener diode, and the Zener diode ZD-8 is an example of a fourth Zener diode.

One end of the capacitor Ccp is connected to the clock output port 42-26. One end of the capacitor CcpL is connected to the clock output port 42-25. The other end of the capacitor Ccp is connected to the drain of the NMOS transistor Mn22 and the gate of the NMOS transistor Mn12. A connection point thereof is called a node N10.

The source of the NMOS transistor Mn22 is connected to the source of the NMOS transistor Mn12. The sources and the back gates of the NMOS transistors Mn12 and Mn22 are respectively connected to each other. That is, the source and the back gate of the NMOS transistor Mn22 and the source and the back gate of the NMOS transistor Mn12 are respectively connected to each other. A connection point thereof is called a node N12. The drain of the NMOS transistor Mn12 is connected to the other end of the capacitor CcpL and the gate of the NMOS transistor Mn22. A connection point thereof is called a node N11.

The Zener diode ZD-5 is further connected between the node N11 and the node N12. The Zener diode ZD-5 includes a cathode connected to the node N11 and an anode connected to the node N12.

Also, the Zener diode ZD-6 is further connected between the node N10 and the node N12. The Zener diode ZD-6 includes a cathode connected to the node N10 and an anode connected to the node N12.

The second step-up circuit 40-22 configured in this way operates as a step-up circuit that steps up the input voltage and outputs the stepped-up voltage. The second step-up circuit 40-22 is configured to be capable of outputting a control signal for controlling the operation state of the NMOS transistor from each of the nodes N10 and N11. The withstand voltages of the capacitors Ccp and CcpL are selected in consideration of the voltage received by the second step-up circuit 40-22.

Also, the second step-down circuit 40-21 and the second step-up circuit 40-22 are connected at the node N9 and the node N12. Furthermore, the node N9 and the node N12 are connected to a connection point between the port TB and the source of the NMOS transistor Mns12 of the first MOS switch 41-21 and the source of the NMOS transistor Mns22 of the second MOS switch 41-22. Thus, the node N9, the node N12, the port TB, the source of the NMOS transistor Mns12, and the source of the NMOS transistor Mns22 form the same node.

In the second switch 41-2, the first MOS switch 41-21 includes one NMOS transistor Mns12 and one PMOS transistor Mps12. In the first MOS switch 41-21, the NMOS transistor Mns12 and the PMOS transistor Mps12 are connected. Also, the sources and the back gates of the NMOS transistor Mns12 and the PMOS transistor Mps12 are respectively connected to each other.

The source of the NMOS transistor Mns12 is connected to the port TB and the back gate of the NMOS transistor Mn12. The drain of the NMOS transistor Mns12 is connected to the source of the PMOS transistor Mps12. The drain of the PMOS transistor Mps12 is connected to a signal output port To2.

The gate of the NMOS transistor Mns12 is connected to the cathode of the Zener diode ZD-5, the drain of the NMOS transistor Mn12, the gate of the NMOS transistor Mn22, and the other end of the capacitor CcpL.

The gate of the PMOS transistor Mps12 is connected to the anode of the Zener diode ZD-7, the drain of the PMOS transistor Mp12, the gate of the PMOS transistor Mp22, and the other end of the capacitor CcnH.

Figure 4:
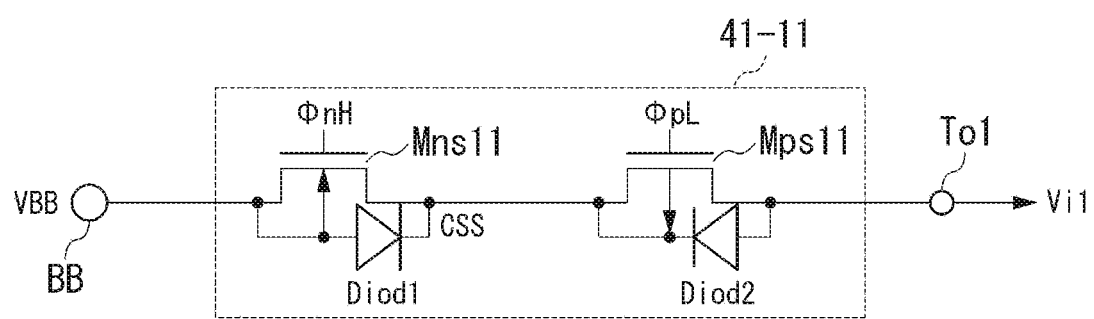
FIG. 4 is a diagram illustrating details of the first switch.

FIG. 4 is a diagram illustrating details of the first switch. As an example, the first MOS switch 41-11 included in the first switch 41-1 will be described. As described above, the first MOS switch 41-11 includes the NMOS transistor Mns11 and the PMOS transistor Mps11. Further, the first MOS switch 41-11 includes a parasitic diode Diod1 and a parasitic diode Diod2.

In the first MOS switch 41-11, the NMOS transistor Mns11 and the PMOS transistor Mps11 are connected. Further, in the NMOS transistor Mns11, the source and the back gate thereof are connected to the anode of the parasitic diode Diod1, and the drain thereof is connected to the cathode of the parasitic diode Diod1. In the PMOS transistor Mps11, the source and the back gate thereof are connected to the cathode of the parasitic diode Diod2, and the drain thereof is connected to the anode of the parasitic diode Diod2.

A case of switch-on and a case of switch-off will be described separately.

In the case of switch-on, Equations (1) and (2) are established.

$$\Phi nH = VBB + vd \quad (1)$$

$$\Phi pL = VBB - vd \quad (2)$$

In Equations (1) and (2), vd is a desired voltage, and vd>>|vth| (vth: threshold voltage of MOS transistor (the NMOS transistor Mns11, the PMOS transistor Mps11).

The NMOS transistor Mns11 and the PMOS transistor Mps11 are brought into a conduction state and turned on as a switch. As a result, Vil=VBB.

In the case of switch-off, Equation (3) is established.

$$\Phi nH = \Phi pL = VBB \quad (3)$$

Thus, the MOS is turned off. Since the state before turning off is on, CSS is about VBB.

After the switch-off, Vil becomes VTB.

(1) In response to Vil=VTB<VBB, the PMOS transistor Mps11 is in a non-conduction state and the switch is turned off.

(2) In response to Vil=VTB>VBB, the parasitic diode Diod2 is in a forward direction, and the ports Vil and CSS are in the conduction state. CSS becomes a voltage equal to or higher than VBB, but the parasitic diode Diod1 is in a reverse direction, and thus there is no conduction between VBB and CSS. Since there is no conduction between VBB and Vil, the switch is turned off.

Returning to FIG. 3, the operation of the first switch SW1 will be described.

The first switch SW1 generates four types of non-overlap clocks from the clock signal Φcko in the non-overlap clock generation circuit 42.

The first switch 41-1 and the second switch 41-2 switch and output the voltage VBB and the voltage VTB at both ends of the bus bar 20 to the output ports Vi1 and Vi2, respectively.

The first clock bootstrap circuit 40-1 steps up or steps down a gate signal for on/off controlling each of the NMOS transistor Mns11, the PMOS transistor Mps11, the NMOS transistor Mns21, and the PMOS transistor Mps21 included in the first switch 41-1 by a voltage vd with the voltage VBB of the bus bar 20 as a reference.

The second clock bootstrap circuit 40-2 steps up or steps down a gate signal for on/off controlling each of the NMOS transistor Mns12, the PMOS transistor Mps12, the NMOS transistor Mns22, and the PMOS transistor Mps22 included in the second switch 41-2 by the voltage vd with the voltage VTB of the bus bar 20 as a reference.

Figure 5:
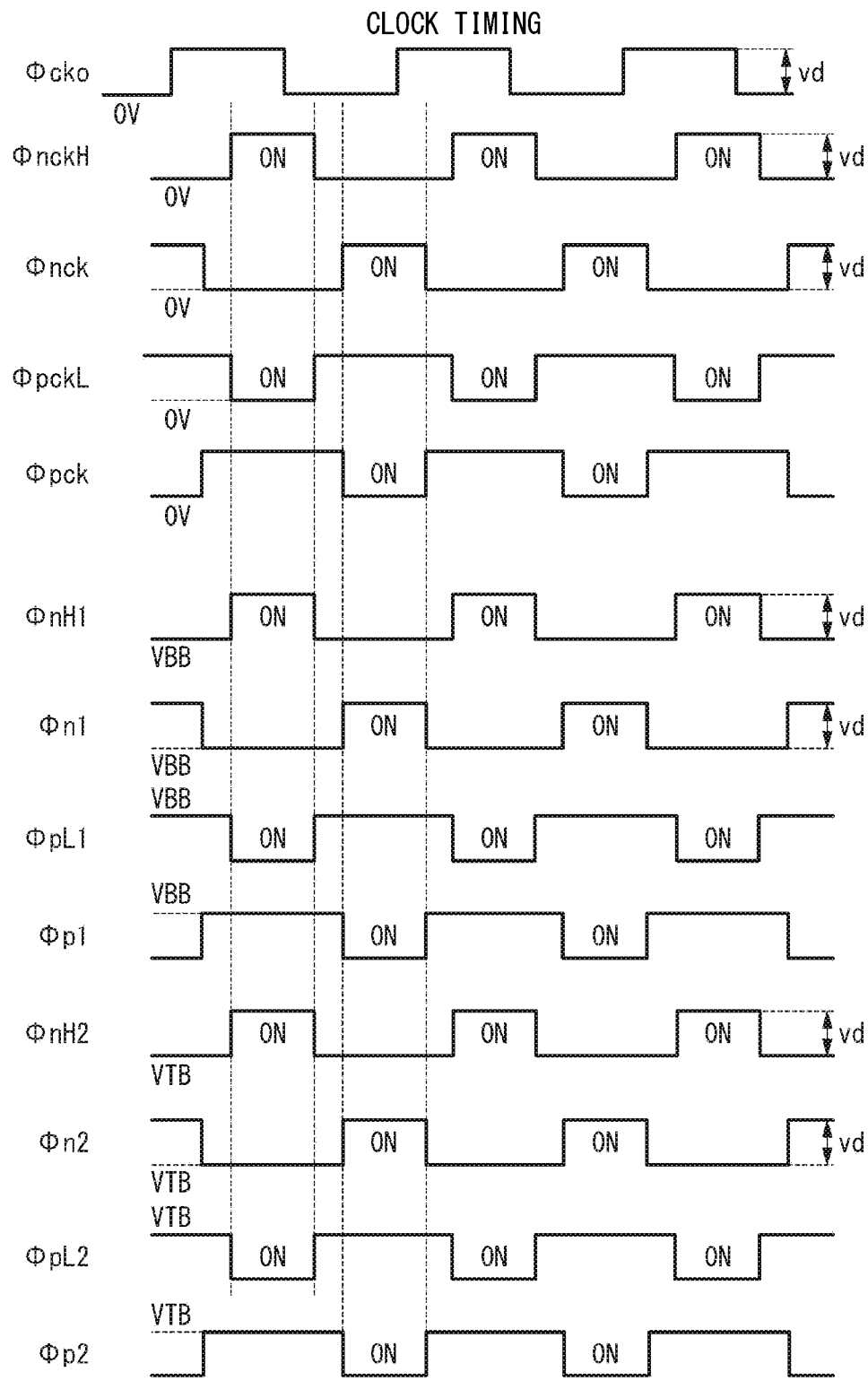
FIG. 5 is a diagram illustrating an example of a timing chart of the first switch of the battery system according to the embodiment.

FIG. 5 is a diagram illustrating an example of a timing chart of the first switch of the battery system according to the embodiment.

The non-overlap clock generation circuit 42 receives a clock signal Φcko serving as a reference clock from the clock input port 42-1. The non-overlap clock generation circuit 42 generates a plurality of different clocks including a clock signal Φnck, a clock signal ΦnckH, a clock signal Φpck, and a clock signal ΦpckL based on the input clock signal Φcko received from the clock input port 42-1. The clock signal ΦnckH is an example of a first clock, the clock signal ΦpckL is an example of a second clock, the clock signal Φnck is an example of a third clock, and the clock signal Φpck is an example of a fourth clock.

Signal levels of the clock signal Φnck, the clock signal ΦnckH, the clock signal Φpck, and the clock signal ΦpckL transition between a high level (hereinafter, referred to as a "H level") and a low level (hereinafter, referred to as a "L level") at the timings illustrated in FIG. 5.

Specifically, the clock signal Φnck and the clock signal ΦnckH are generated at timings that do not become the H level in the same period. That is, the clock signal ΦnckH is at the L level during a period in which the clock signal Φnck is at the H level. The clock signal Φpck and the clock signal ΦpckL are generated at timings that do not become the L level in the same period. That is, the clock signal ΦpckL is at the H level during a period in which the clock signal Φpck is at the L level.

Also, the clock signal Φnck and the clock signal Φpck are generated at timings with opposite polarities. Furthermore, the clock signal ΦnckH and the clock signal ΦpckL are generated at timings with opposite polarities. For the input clock signal Φcko, the clock signal Φnck, the clock signal ΦnckH, the clock signal Φpck, and the clock signal ΦpckL, a difference in voltage between the H level and the L level is a voltage vd.

The non-overlap clock generation circuit 42 outputs the generated clock signal Φpck, clock signal ΦpckL, clock signal Φnck and clock signal ΦnckH to the clock output port 42-21, the clock output port 42-22, the clock output port 42-23 and the clock output port 42-24, respectively.

The clock signal Φpck received by the clock output port 42-21, the clock signal ΦpckL received by the clock output port 42-22, the clock signal Φnck received by the clock output port 42-23, and the clock signal ΦnckH received by the clock output port 42-24 are respectively applied to the gate of the PMOS transistor Mps21 of the second MOS switch 41-12, the gate of the PMOS transistor Mps11 of the first MOS switch 41-11, the gate of the NMOS transistor Mns21 of the second MOS switch 41-12, and the gate of the NMOS transistor Mns11 of the first MOS switch 41-11, In the first step-down circuit 40-11, the voltage VBB at the port BB is applied to each of the sources and the back gates of the PMOS transistors Mp21 and Mp11. The PMOS transistors Mp21 and Mp11 are operated exclusively by the input clock signals Φpck and ΦpckL. That is, in a case where the PMOS transistor Mp21 is in an ON state, the PMOS transistor Mp11 is in an OFF state, and in a case where the PMOS transistor Mp11 is in the ON state, the PMOS transistor Mp21 is in the OFF state. The PMOS transistors Mp21 and Mp11 are allowed to be in the OFF state during the same period.

Due to the operation described above, the voltages of the nodes N1 and N2 are controlled between the voltage VBB as a reference voltage and a voltage stepped down from the reference voltage (hereinafter, referred to as a "stepped-down voltage"). That is, the first step-down circuit 40-11 generates a signal that sets the voltage VBB, which is the reference voltage, to the H level and the stepped-down voltage to the L level, based on the voltage VBB and voltages of the clock signals Φpck and ΦpckL.

The generated signal is output from each of the nodes N1 and N2, as a control signal for controlling the ON/OFF states of the PMOS transistors Mps21 and Mps11. The gate of the PMOS transistor Mps21 receives a signal Φp1 output from the node N1. The gate of the PMOS transistor Mps11 receives a signal ΦpL1 output from the node N2.

In the first step-up circuit 40-12, the voltage VBB at the port BB is applied to each of the sources and the back gates of the NMOS transistors Mn21 and Mn11. The NMOS transistors Mn21 and Mn11 are operated exclusively by the input clock signals Φnck and ΦnckH. That is, in a case where the NMOS transistor Mn21 is in the ON state, the NMOS transistor Mn11 is in the OFF state, and in a case where the NMOS transistor Mn11 is in the ON state, the NMOS transistor Mn21 is in the OFF state. The NMOS transistors Mn21 and Mn11 are allowed to be in the OFF state during the same period.

Due to the operation described above, the voltages of the nodes N4 and N5 are controlled between the voltage VBB as the reference voltage and a voltage stepped up from the reference voltage (hereinafter referred to as a "stepped-up voltage"). That is, the first step-up circuit 40-12 generates a signal that sets the voltage VBB, which is the reference voltage, to the L level and the stepped-up voltage to the H level, based on the voltage VBB and the voltages of the clock signals Φnck and ΦnckH.

The generated signal is output from each of the nodes N4 and N5, as a control signal for controlling the ON/OFF states of each of the NMOS transistors Mns11 and Mns21. The gate of the NMOS transistor Mns21 receives a signal Φn1 output from the node N4. The gate of the NMOS transistor Mns11 receives a signal ΦnH1 output from the node N5.

The first switch 41-1 serves as a switching device capable of switching between the ON state and the OFF state based on the signal Φp1, the signal ΦpL1, the signal Φn1, and the signal ΦnH1 received from the first clock bootstrap circuit 40-1. In the ON state, the voltage VBB received by the port BB is output from the signal output port To1. On the other hand, in the OFF state, the voltage VBB received by the port BB is not output from the signal output port To1.

The first switch 41-1 conducts between the port BB and the signal output port To1 during a period in which the clock signal ΦpckL is at the L level and the clock signal ΦnckH is at the H level. The first switch 41-1 conducts between the port BB and the signal output port To2 during a period in which the clock signal Φpck is at the L level and the clock signal Φnck is at the H level.

The ON state of the first switch 41-1 is a state in which the port BB and the signal output port To1 or the signal output port To2 are in the conduction state. The first switch 41-1 is in the OFF state during periods other than the above, specifically, during periods in which a voltage equal to the voltage VBB is applied to the gate of each of the NMOS transistors Mns11 and Mns21 and the PMOS transistors Mps11 and Mps21.

The non-overlap clock generation circuit 42 outputs the generated clock signal Φpck, clock signal ΦpckL, clock signal Φnck and clock signal ΦnckH to the clock output port 42-28, the clock output port 42-27, the clock output port 42-26, and the clock output port 42-25, respectively.

The clock signal Φpck received by the clock output port 42-28, the clock signal ΦpckL received by the clock output port 42-27, the clock signal Φnck received by the clock output port 42-26 and the clock signal ΦnckH received by the clock output port 42-25 are respectively applied to the gate of the PMOS transistor Mps22 of the second MOS switch 41-22, the gate of the PMOS transistor Mps12 of the first MOS switch 41-21, the gate of the NMOS transistor Mns22 of the second MOS switch 41-22, and the gate of the NMOS transistor Mns12 of the first MOS switch 41-21.

In the second step-down circuit 40-21, the voltage VTB at the port TB is applied to each of the sources and back gates of the PMOS transistors Mp22 and Mp12. The PMOS transistors Mp22 and Mp12 are operated exclusively by the input clock signals Φpck and ΦpckL. That is, in a case where the PMOS transistor Mp22 is in the ON state, the PMOS transistor Mp12 is in the OFF state, and in a case where the PMOS transistor Mp12 is in the ON state, the PMOS transistor Mp22 is in the OFF state. The PMOS transistors Mp22 and Mp12 are allowed to be in the OFF state during the same period.

Due to the operation described above, the voltages of the nodes N7 and N8 are controlled between the voltage VTB as the reference voltage and a voltage stepped down from the reference voltage (hereinafter, referred to as a "stepped-down voltage"). That is, the second step-down circuit 40-21 generates a signal that sets the voltage VTB, which is the reference voltage, to the H level and the step-down voltage to the L level, based on the voltage VTB and the voltages of the clock signals Φpck and ΦpckL. The generated signal is output from each of the nodes N7 and N8, as a control signal for controlling the ON/OFF states of each of the PMOS transistors Mps22 and Mps12. The gate of the PMOS transistor Mps22 receives a signal Φp2 output from the node N7. The gate of the PMOS transistor Mps12 receives a signal ΦpL2 output from the node N8.

In the second step-up circuit 40-22, the voltage VTB at the port TB is applied to each of the sources and back gates of the NMOS transistors Mn22 and Mn12. The NMOS transistors Mn22 and Mn12 are operated exclusively by the input clock signals Φnck and ΦnckH. That is, in a case where the NMOS transistor Mn22 is in the ON state, the NMOS transistor Mn12 is in the OFF state, and in a case where the NMOS transistor Mn12 is in the ON state, the NMOS transistor Mn22 is in the OFF state. The NMOS transistors Mn22 and Mn12 are allowed to be in the OFF state during the same period.

Due to the operation described above, the voltages of the nodes N10 and N11 are controlled between the voltage VTB as the reference voltage and a voltage stepped up from the reference voltage (hereinafter, referred to as a "stepped-up voltage"). That is, the second step-up circuit 40-22 generates a signal that sets the reference voltage VTB, which is the reference voltage, to the L level and the stepped-up voltage to the H level, based on the voltage VTB and the voltages of the clock signals Φnck and ΦnckH.

The generated signal is output from each of the nodes N10 and N11 as a control signal for controlling the ON/OFF states of each of the NMOS transistors Mns12 and Mns22. The gate of the NMOS transistor Mns22 receives a signal Φn2 output from the node N10. The gate of the NMOS transistor Mns12 receives a signal ΦnH2 output from the node N11.

The second switch 41-2 serves as a switching device capable of switching between the ON state and the OFF state based on the signal Φp2, the signal ΦpL2, the signal Φn2, and the signal ΦnH2 received from the second clock bootstrap circuit 40-2. In the ON state, the voltage VTB received by the port TB is output from the signal output port To2. On the other hand, in the OFF state, the voltage VTB received by the port TB is not output from the signal output port T02.

The second switch 41-2 conducts between the port TB and the signal output port To2 during a period in which the clock signal ΦpckL is at the L level and the clock signal ΦnckH is at the H level. The second switch 41-2 conducts between the port TB and the signal output port To1 during a period in which the clock signal Φpck is at the L level and the clock signal Φnck is at the H level. The ON state of the second switch 41-2 is a state in which the port TB and the signal output port To1 or the signal output port To2 are in the conduction state. The second switch 41-2 is in the OFF state during periods other than the above, specifically during periods in which the voltage equal to the voltage VTB is applied to the gate of each of the NMOS transistors Mns12 and Mns22 and the PMOS transistors Mps12 and Mps22.

As described above, according to the battery voltage monitoring device of the embodiment, even in a case where the switch circuit is in the OFF state and there is a difference in voltage between the input and output of the switch, the current does not flow backward, and thus it can be built into the battery system. Since the current flowing through the bus bar is in the reverse direction during charging and discharging, the voltages generated at both ends of the bus bar are reversed in magnitude at both ends. In other words, the positive and negative polarities are reversed during charging and discharging. Although the polarities of the terminal voltages VTB and VBB of the bus bar 20 are reversed, the switching circuit can be configured so that the current does not flow backward.

Although the embodiment of the present invention has been described in detail above with reference to the drawings, the specific configuration is not limited to the embodiment, and design changes and the like are included within the scope of the present invention.

For example, the second ADC 36-1 of the battery voltage monitoring IC 30-1 has been described as having a higher voltage than that of the first ADC 34-1, but the present invention is not limited to this example. For example, the second ADC 36-1 of the battery voltage monitoring IC may be fabricated to have a lower voltage than that of the first ADC 34-1.

What is claimed is:

1. A battery voltage monitoring device for monitoring voltages at both ends of a bus bar, which comprises a signal input unit having input ports which receive the voltages at both ends of the bus bar, and an analog-digital conversion circuit configured to measure a difference voltage between the voltages at both ends of the bus bar, the battery voltage monitoring device comprising:

a clock generation circuit configured to generate a plurality of clocks including a first clock, a second clock having a polarity opposite to that of the first clock, a third clock being at a low level while the first clock is at a high level, and a fourth clock having a polarity opposite to that of the third clock and being at a high level while the second clock is at a low level, based on an input reference clock;

a switch circuit including a first N-type transfer transistor and a second N-type transfer transistor that are N-type field effect transistors of which sources and back gates are connected, and a first P-type transfer transistor and a second P-type transfer transistor that are P-type field effect transistors of which sources and back gates are connected, a drain of one of the first N-type transfer transistor and the first P-type transfer transistor being connected to a source of the other transfer transistor, a source of one transfer transistor being connected to a first signal input port, a drain of the other transfer transistor being connected to a first signal output port, a drain of one of the second N-type transfer transistor and the second P-type transfer transistor being connected to a source of the other transfer transistor, a source of one transfer transistor being connected to the first signal input port, and a drain of the other transfer transistor being connected to a second signal output port;

a first control signal generation circuit configured to generate a first control signal for controlling an ON state and an OFF state of the first P-type transfer transistor based on a voltage of the first signal input port and the second clock, and configured to generate a second control signal for controlling an ON state and an OFF state of the second P-type transfer transistor based on the voltage of the first signal input port and the fourth clock; and a second control signal generation circuit configured to generate a third control signal for controlling an ON state and an OFF state of the first N-type transfer transistor based on the voltage of the first signal input port and the first clock, and configured to generate a fourth control signal for controlling an ON state and an OFF state of the second N-type transfer transistor based on the voltage of the first signal input port and the third clock.

2. The battery voltage monitoring device according to claim 1, wherein:
the clock generation circuit includes a clock input port which receives the reference clock, a first clock output port configured to output the first clock, a second clock output port configured to output the second clock, a third clock output port configured to output the third clock, and a fourth clock output port configured to output the fourth clock;
the first control signal generation circuit includes a first P-type FET which is a P-type field effect transistor to which a source and a back gate are connected, a second P-type FET of which a source is connected to the source and back gate of the first P-type FET and its own back gate, a first capacitor having one end connected to the fourth clock output port and the other end connected to a drain of the second P-type FET and a gate of the first P-type FET, a second capacitor having one end connected to the second clock output port and the other end connected to a drain of the first P-type FET and a gate of the second P-type FET, a first Zener diode including an anode connected to the drain of the first P-type FET and a cathode connected to the source and back gate of the second P-type FET, and a second Zener diode including an anode connected to the drain of the second P-type FET and a cathode connected to the source and back gate of the first P-type FET;
the second control signal generation circuit includes a first N-type FET which is an N-type field effect transistor to which a source and a back gate are connected, a second N-type FET of which a source is connected to the source and back gate of the first N-type FET and its own back gate, a third capacitor having one end connected to the third clock output port and the other end connected to a drain of the second N-type FET and a gate of the first N-type FET, a fourth capacitor having one end connected to the first clock output port and the other end connected to a drain of the first N-type FET and a gate of the second N-type FET, a third Zener diode including a cathode connected to the drain of the first N-type FET and an anode connected to the source and back gate of the first N-type FET, and a fourth Zener diode including a cathode connected to the drain of the second N-type FET and an anode connected to the source and back gate of the second N-type FET;
a connection point between the first signal input port and the source of the one transfer transistor is connected to a first node and a second node;
the first node is a node to which the source and back gate of the first P-type FET, the source and back gate of the second P-type FET, the cathode of the first Zener diode, and the cathode of the second Zener diode are connected; and
the second node is a node that is a connection point between the source and back gate of the first N-type FET, the source and back gate of the second N-type FET, the anode of the third Zener diode, and the anode of the fourth Zener diode.

3. The battery voltage monitoring device according to claim 2, wherein:
the first control signal generation circuit includes a third node and a fourth node;
the second control signal generation circuit includes a fifth node and a sixth node;
the third node is a connection point between the drain of the first P-type FET of the first control signal generation circuit, the gate of the second P-type FET, the other end of the second capacitor, and the anode of the first Zener diode;
the fourth node is a connection point between the drain of the second P-type FET of the first control signal generation circuit, the gate of the first P-type FET, the other end of the first capacitor, and the anode of the second Zener diode;
the fifth node is a connection point between the drain of the first N-type FET of the second control signal generation circuit, the gate of the second N-type FET, the other end of the fourth capacitor, and the cathode of the third Zener diode;
the sixth node is a connection point between the drain of the second N-type FET of the second control signal generation circuit, the gate of the first N-type FET, the other end of the third capacitor, and the cathode of the fourth Zener diode;
the first P-type transfer transistor includes a gate connected to the third node;
the second P-type transfer transistor includes a gate connected to the fourth node;
the first N-type transfer transistor includes a gate connected to the fifth node; and
the second N-type transfer transistor includes a gate connected to the sixth node.

4. The battery voltage monitoring device according to claim 3, further comprising:
a third control signal generation circuit having the same configuration as the first control signal generation circuit and configured to generate a fifth control signal that is the same as the first control signal and a sixth control signal that is the same as the second control signal; and
a fourth control signal generation circuit having the same configuration as the second control signal generation circuit and configured to generate a seventh control signal having a polarity opposite to that of the fifth control signal and being at a low level during a period in which the fifth control signal is at a high level, and an eighth control signal having a polarity opposite to that of the sixth control signal and being at a low level during a period in which the sixth control signal is at a high level,
wherein:
the third control signal generation circuit includes a seventh node and an eighth node;
the fourth control signal generation circuit includes a ninth node and a tenth node;
the seventh node is a connection point between the drain of the second P-type FET of the third control signal generation circuit, the gate of the first P-type FET, the other end of the first capacitor, and the anode of the first Zener diode;
the eighth node is a connection point between the drain of the first P-type FET of the third control signal generation circuit, the gate of the second P-type FET, the other end of the second capacitor, and the anode of the second Zener diode;
the ninth node is a connection point between the drain of the second N-type FET of the fourth control signal generation circuit, the gate of the first N-type FET, the other end of the third capacitor, and the cathode of the third Zener diode;

the tenth node is a connection point between the drain of the first N-type FET of the fourth control signal generation circuit, the gate of the second N-type FET, the other end of the fourth capacitor, and the cathode of the fourth Zener diode;

the signal input unit further includes a second signal input port;

the switch circuit further includes a third N-type transfer transistor and a fourth N-type transfer transistor of which sources and back gates are connected, and a third P-type transfer transistor and a fourth P-type transfer transistor of which sources and back gates are connected;

a drain of one of the third N-type transfer transistor and the third P-type transfer transistor is connected to the source of the other transfer transistor, a source of one transfer transistor is connected to the second signal input port, and a drain of the other transfer transistor is connected to the drain of one of the second N-type transfer transistor and the second P-type transfer transistor and the second signal output port;

a drain of one of the fourth N-type transfer transistor and the fourth P-type transfer transistor is connected to the source of the other transfer transistor, a source of one transfer transistor is connected to the second signal input port, and the drain of the other transfer transistor is connected to the drain of one of the first N-type transfer transistor and the first P-type transfer transistor and the first signal output port;

the third P-type transfer transistor includes a gate connected to the seventh node in a case where the first P-type FET includes a gate connected to the fourth node, and includes a gate connected to the eighth node in a case where the first P-type FET includes a gate connected to the third node;

the third N-type transfer transistor includes a gate connected to the seventh node in a case where the first P-type FET includes a gate connected to the third node, and includes a gate connected to the eighth node in a case where the first P-type FET includes a gate connected to the fourth node;

the fourth P-type transfer transistor includes a gate connected to the ninth node in a case where the first N-type FET includes a gate connected to the sixth node, and includes a gate connected to the tenth node in a case where the first N-type FET includes a gate connected to the fifth node; and the fourth N-type transfer transistor includes a gate connected to the ninth node in a case where the first N-type FET includes a gate connected to the fifth node, and includes a gate connected to the tenth node in a case where the first P-type FET includes a gate connected to the sixth node.

5. The battery voltage monitoring device according to claim 1, wherein the first control signal generation circuit is configured to generate the first control signal and the second control signal including a first level that is the same voltage as that of the first signal input port and a second level that is lower in voltage than the first level.

6. The battery voltage monitoring device according to claim 1, wherein the second control signal generation circuit is configured to generate the third control signal and the fourth control signal including a first level that is the same voltage as the first signal input port and a third level that is higher in voltage than the first level.

* * * * *

UNITED STATES PATENT AND TRADEMARK OFFICE
CERTIFICATE OF CORRECTION

Page 1 of 1

PATENT NO. : 12,306,255 B2
APPLICATION NO. : 18/184633
DATED : May 20, 2025
INVENTOR(S) : Eiki Imaizumi et al.

It is certified that error appears in the above-identified patent and that said Letters Patent is hereby corrected as shown below:

On the Title Page

Item (73) Assignees should read: ABLIC Inc., Nagano (JP); Tianjin Lishen Battery Co., Ltd., Tianjin (CN)

Signed and Sealed this
Twenty-second Day of July, 2025

Coke Morgan Stewart
*Acting Director of the United States Patent and Trademark Office*